(12) United States Patent
Jeong (10) Patent No.: US 9,281,341 B2
(45) Date of Patent: Mar. 8, 2016

(54) LIGHT EMITTING DEVICE AND FABRICATING METHOD THEREOF

(75) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 544 days.

(21) Appl. No.: 13/358,266

(22) Filed: Jan. 25, 2012

(65) Prior Publication Data

US 2012/0187438 A1 Jul. 26, 2012

(30) Foreign Application Priority Data

Jan. 26, 2011 (KR) .................. 10-2011-0007742

(51) Int. Cl.
*H01L 33/02* (2010.01)
*H01L 27/15* (2006.01)
*H01L 27/12* (2006.01)

(52) U.S. Cl.
CPC ............. *H01L 27/15* (2013.01); *H01L 27/1266* (2013.01)

(58) Field of Classification Search
CPC ........................... H01L 27/1266; H01L 27/15
USPC .............................................. 257/98, 79, 288
See application file for complete search history.

(56) References Cited

U.S. PATENT DOCUMENTS

| 6,207,977 | B1 * | 3/2001 | Augusto | 257/192 |
| 8,120,060 | B2 * | 2/2012 | Fitzgerald | 257/184 |
| 8,466,480 | B2 * | 6/2013 | Cho et al. | 257/98 |
| 2004/0157353 | A1 * | 8/2004 | Ouyang et al. | 438/38 |
| 2004/0178442 | A1 | 9/2004 | Kuranayashi et al. | |
| 2006/0081857 | A1 | 4/2006 | Hong et al. | |
| 2007/0105256 | A1 | 5/2007 | Fitzgerald | |
| 2010/0207153 | A1 * | 8/2010 | Jung | H01L 33/483 257/98 |
| 2012/0068207 | A1 | 3/2012 | Hata et al. | |

FOREIGN PATENT DOCUMENTS

| CN | 101326646 A | 12/2008 | |
| DE | 102005043649 A1 | 4/2006 | |
| EP | 0233725 A2 | 8/1987 | |
| JP | 62-190756 A | 8/1987 | |
| JP | 2001-127278 A | 5/2001 | |
| JP | 2003-37268 A | 2/2003 | |
| JP | 2003037268 * | 2/2003 | ............ H01L 29/786 |
| KR | 1995-0006177 B1 | 6/1995 | |
| WO | WO 2010/140370 A1 | 12/2010 | |

* cited by examiner

*Primary Examiner* — Ermias Woldegeorgis
*Assistant Examiner* — Benjamin Tzu-Hung Liu
(74) *Attorney, Agent, or Firm* — Birch, Stewart, Kolasch & Birch, LLP (57) ABSTRACT

Disclosed is a light emitting device including a support substrate, a transistor unit disposed at one side of the upper surface of the support substrate, a light emitting device unit disposed at the other side of the upper surface of the support substrate, and an insulating layer disposed between the transistor unit and the light emitting device unit and between the support substrate and the transistor unit and isolating the transistor unit from the light emitting device unit.

19 Claims, 5 Drawing Sheets

LIGHT EMITTING DEVICE AND FABRICATING METHOD THEREOF

CROSS REFERENCE TO RELATED APPLICATION

This application claims priority under 35 U.S.C. §119 to Korean Patent Application No. 10-2011-0007742 filed in Korea on Jan. 26, 2011 which is hereby incorporated in its entirety by reference as if fully set forth herein.

TECHNICAL FIELD

Embodiments relate to a light emitting device formed in association with transistors.

BACKGROUND

Light emitting devices, such as light emitting diodes or laser diodes, using group III-V or II-VI compound semiconductor materials may produce light of various colors, such as red, green, blue, and ultraviolet light, due to development of thin film growth techniques and device materials. Further, the light emitting devices may produce white light having high efficiency using phosphor materials or through color mixing. The light emitting devices have advantages, such as low power consumption, semi-permanent lifespan, rapid response time, stability, and environmental friendliness as compared to conventional light sources, such as fluorescent lamps and incandescent lamps.

Therefore, these light emitting devices are increasingly applied to transmission modules of optical communication units, light emitting diode backlight units substituting for cold cathode fluorescent lamps (CCFLs) constituting backlight units of liquid crystal display (LCD) devices, lighting apparatuses using white light emitting diodes substituting for fluorescent lamps or incandescent lamps, head-lights for vehicles and traffic lights.

SUMMARY

Embodiments provide a light emitting device formed in association with transistors.

In one embodiment, a light emitting device includes a bonding layer disposed on a support substrate, an insulating layer disposed at one side on the bonding layer, a transistor unit disposed on the insulating layer, and a light emitting device unit disposed at the other side on the bonding layer and including a first conductivity-type semiconductor layer, an active layer and a second conductivity-type semiconductor layer, wherein the transistor unit and the light emitting device unit are isolated from each other by the insulating layer.

The transistor unit may be operated as a switch of the light emitting device unit.

The transistor unit may include a third conductivity-type semiconductor layer disposed on the insulating layer, an undoped semiconductor layer disposed on the third conductivity-type semiconductor layer, a fourth conductivity-type semiconductor layer disposed on the undoped semiconductor layer, a fifth conductivity-type semiconductor layer disposed on the fourth conductivity-type semiconductor layer, a gate insulating film disposed on the undoped semiconductor layer, a gate electrode disposed on the gate insulating film, a source electrode disposed on the fifth conductivity-type semiconductor layer, and a drain electrode disposed on the third conductivity-type semiconductor layer.

Current between the source electrode and the drain electrode may be controlled by voltage between the gate electrode and the source electrode, and be applied to at least one of electrodes disposed on the first conductivity-type semiconductor layer or the second conductivity-type semiconductor layer of the light emitting device unit.

The third conductivity-type semiconductor layer may be electrically isolated from the first conductivity-type semiconductor layer by the insulating layer.

In another embodiment, a light emitting device includes a bonding layer disposed on a support substrate, an insulating layer disposed at one side on the bonding layer, and a transistor unit disposed on the insulating layer, wherein the transistor unit includes a third conductivity-type semiconductor layer disposed on the insulating layer, an undoped semiconductor layer disposed on the third conductivity-type semiconductor layer, a fourth conductivity-type semiconductor layer disposed on the undoped semiconductor layer, a fifth conductivity-type semiconductor layer disposed on the fourth conductivity-type semiconductor layer, a gate insulating film disposed on the undoped semiconductor layer, a gate electrode disposed on the gate insulating film, a source electrode disposed on the fifth conductivity-type semiconductor layer, and a drain electrode disposed on the third conductivity-type semiconductor layer.

The light emitting device may further include a light emitting device unit disposed at the other side on the bonding layer and including a first conductivity-type semiconductor layer, an active layer and a second conductivity-type semiconductor layer, and the transistor unit and the light emitting device unit may be isolated from each other by the insulating layer.

The third conductivity-type semiconductor layer may be electrically isolated from the first conductivity-type semiconductor layer by the insulating layer.

In another embodiment, a light emitting device includes a support substrate, a transistor unit disposed at one side of the upper surface of the support substrate, a light emitting device unit disposed at the other side of the upper surface of the support substrate, and an insulating layer disposed between the transistor unit and the light emitting device unit and between the support substrate and the transistor unit, and isolating the transistor unit from the light emitting device unit.

The light emitting device may further include a bonding layer disposed between the support substrate and the insulating layer and between the support substrate and the light emitting device unit, and at least one channel layer disposed between the bonding layer and the edge of the lower surface of the light emitting device unit.

The at least one channel layer may be disposed between the bonding layer and the insulating layer.

The light emitting device unit may include a first conductivity-type semiconductor layer, an active layer and a second conductivity-type semiconductor layer sequentially disposed on the other side of the upper surface of the support substrate.

The transistor unit may include a third conductivity-type semiconductor layer disposed on the insulating layer, an undoped semiconductor layer disposed on the third conductivity-type semiconductor layer, a fourth conductivity-type semiconductor layer disposed on the undoped semiconductor layer, a fifth conductivity-type semiconductor layer disposed on the fourth conductivity-type semiconductor layer, a gate insulating film disposed on the undoped semiconductor layer, a gate electrode disposed on the gate insulating film, a source electrode disposed on the fifth conductivity-type semiconductor layer, and a drain electrode disposed on the third conductivity-type semiconductor layer.

At least one of the first conductivity-type semiconductor layer or the second conductivity-type semiconductor layer may be formed from the same layer as at least one of the third conductivity-type semiconductor layer, the undoped semiconductor layer, the fourth conductivity-type semiconductor layer or the fifth conductivity-type semiconductor layer.

The first conductivity-type semiconductor layer and the fifth conductivity-type semiconductor layer may include the same material, and the second conductivity-type semiconductor layer and the fourth conductivity-type semiconductor layer may include the same material.

The gate insulating film may extend to one side surface of each of the fourth and fifth conductivity-type semiconductor layers and one portion of the upper surface of the fifth conductivity-type semiconductor layer.

The light emitting device may further include a reflective layer disposed between the support substrate and the second conductivity-type semiconductor layer, and an Ohmic layer disposed between the reflective layer and the second conductivity-type semiconductor layer.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thicknesses or sizes of respective layers are exaggerated, omitted, or schematically illustrated for convenience and clarity of description. Further, the sizes of the respective elements do not denote the actual sizes thereof.

Figure 1:
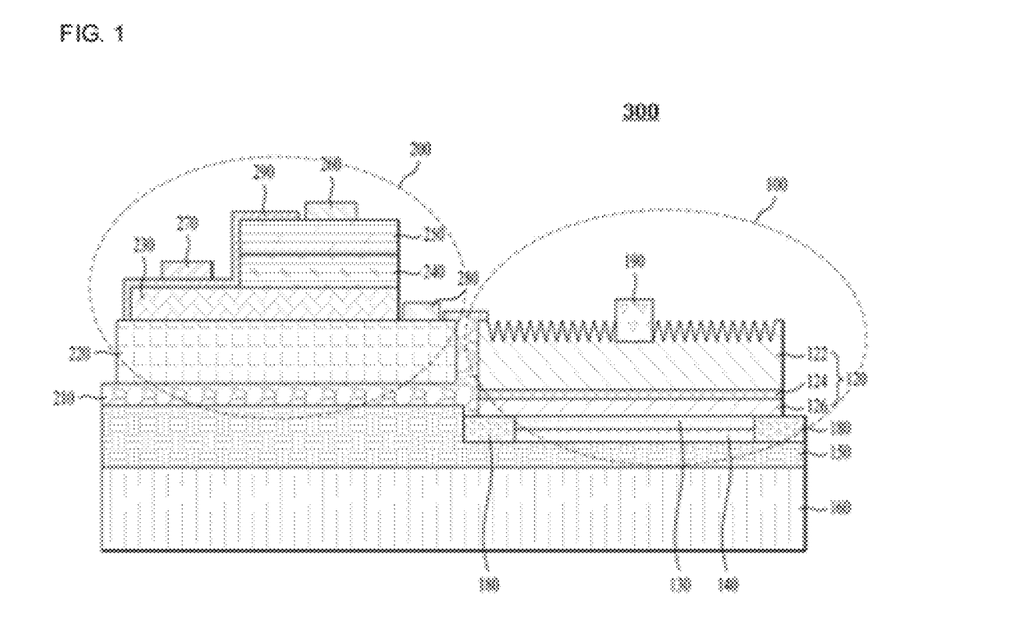
FIG. 1 is a sectional view illustrating a light emitting device formed in association with transistors in accordance with one embodiment.

FIG. 1 is a sectional view illustrating a light emitting device formed in association with transistors in accordance with one embodiment.

As shown in FIG. 1, a light emitting device 300 includes a light emitting device unit 100 and a transistor unit 200. The light emitting device unit 100 and the transistor unit 200 may be formed on the same support substrate 160 and bonding layer 150.

The light emitting device unit 100 may include a reflective layer 140 disposed on the bonding layer 150, an Ohmic layer 130 disposed on the reflective layer 140, a channel layer 180, a light emitting structure 120 including a first conductivity-type semiconductor layer 122, an active layer 124 and a second conductivity-type semiconductor layer 126, and a first electrode 190 disposed on the first conductivity-type semiconductor layer 122.

Further, the transistor unit 200 may include an insulating layer 210 disposed on the bonding layer 150, a third conductivity-type semiconductor layer 220 disposed on the insulating layer 210, an undoped semiconductor layer 230 disposed on the third conductivity-type semiconductor layer 220, a fourth conductivity-type semiconductor layer 240 disposed on the undoped semiconductor layer 230, a fifth conductivity-type semiconductor layer 250 disposed on the fourth conductivity-type semiconductor layer 240, a gate insulating film 290 disposed on the undoped semiconductor layer 230, a gate electrode 270 disposed on the gate insulating film 290, a source electrode 260 disposed on the fifth conductivity-type semiconductor layer 250, and a drain electrode 280 disposed on the third conductivity-type semiconductor layer 220.

The support substrate 160 may be formed of one selected from the group consisting of molybdenum (Mo), silicon (Si), tungsten (W), copper (Cu) and aluminum (Al), or an alloy thereof. Further, for example, the support substrate 160 may selectively include gold (Au), an Cu alloy, nickel (Ni), copper-tungsten (Cu—W), and a carrier wafer (for example, GaN, Si, Ge, GaAs, ZnO, SiGe, SiC, SiGe, $Ga_2O_3$, etc.). As a method for forming the conductive support substrate 160, an electrochemical metal deposition method or a bonding method using a eutectic metal may be used.

Further, the bonding layer 150 to achieve bonding between the support substrate 160 and the light emitting device unit 100 or bonding between the support substrate 160 and the transistor unit 200 may be disposed on the support substrate 160. The bonding layer 150 may be formed of one selected from the group consisting of gold (Au), tin (Sn), indium (In), silver (Ag), nickel (Ni), niobium (Nb) and copper (Cu), or an alloy thereof.

The reflective layer 140 of the light emitting device unit 100 may be formed of metal including aluminum (Al), silver (Ag), nickel (Ni), platinum (Pt), rhodium (Rh), or an alloy including Al, Ag, Pt or Rh. Aluminum (Al) or silver (Ag) effectively reflects light generated from the active layer 124, thereby greatly improving light extraction efficiency of the light emitting device 300.

The Ohmic layer 130 may be stacked to a thickness of about 200 Å. The Ohmic layer 130 may selectively use a light-transmitting conductive layer and metal, and for example, include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf, and is not limited thereto. Further, the Ohmic layer 130 may be formed through sputtering and electron beam deposition.

The channel layer 180 may include at least one of a metal material or an insulating material. When the metal material is used, a material having lower electrical conductivity than the material of the Ohmic layer 130 is used so that current applied to the Ohmic layer 130 is not applied to the channel layer 180.

For example, the channel layer 180 may include at least one of titanium (Ti), nickel (Ni), platinum (Pt), lead (Pb), rhodium (Rh), iridium (Ir) or tungsten (W), or include at least one of aluminum oxide ($Al_2O_3$), silicon oxide ($SiO_2$), silicon nitride ($Si_3N_4$) or titanium oxide (TiOx), or include at least one of indium tin oxide (ITO), aluminum zinc oxide (AZO) or indium zinc oxide (IZO). Further, the channel layer 180 may include at least one of titanium (Ti), nickel (Ni), platinum (Pt), tungsten (W), molybdenum (Mo), vanadium (V) or iron (Fe).

The channel layer 180 has the effect of protecting the elements located under the channel layer 180 from etching during etching of the light emitting structure 120 and stably supporting the light emitting device 300 to prevent the light emitting device 300 from being damaged during a fabrication process.

Further, the first conductivity-type semiconductor layer 122 may be formed of a group III-V compound semiconductor doped with a first conductivity-type dopant, and in case the first conductivity-type semiconductor layer 122 is an N-type semiconductor layer, the first conductivity-type dopant is an N-type dopant and the N-type dopant may include Si, Ge, Sn, Se and Te but is not limited thereto.

The active layer 124 emits light having energy determined by an intrinsic energy band of a material of the active layer (light emitting layer) where the light is generated when electrons injected into the active layer 124 through the first conductivity-type semiconductor layer 122 and holes injected into the active layer 124 through the second conductivity-type semiconductor layer 126 meet.

Further, the second conductivity-type semiconductor layer 126 be formed of a group III-V compound semiconductor doped with a second conductivity-type dopant, for example, a semiconductor material having a formula of $In_xAl_yGa_{1-x-y}N$ ($0 \leq x \leq 1$, $0 \leq y \leq 1$). In case the second conductivity-type semiconductor layer 122 is a P-type semiconductor, the second conductivity-type dopant is a P-type dopant and the P-type dopant may include Mg, Zn, Ca, Sr, Ba, etc.

The upper surface of the first conductivity-type semiconductor layer 122 has an uneven structure to improve light extraction efficiency. Here, the uneven structure may be formed using a dry etching method or a photo chemical wet-etching (PEC) method, or be formed through etching after formation of a mask. As the dry etching method, plasma etching, sputter etching, ion etching, etc. may be used.

Such an uneven structure of the light emitting structure 120 may reduce total reflection on the surface of the first conductivity-type semiconductor layer 122 to increase light extraction effects by changing an angle of incidence of light emitted from the active layer 124 and incident upon the first conductivity-type semiconductor layer 122, and reduce absorption of light emitted from the active layer 124 by the light emitting structure 120 to increase luminous efficiency.

The uneven structure may be formed periodically or aperiodically, and the shape of the uneven structure is not limited thereto. For example, the uneven structure may have a single shape, such as a rectangle, a hemisphere, a triangle or a trapezoid, or a combined shape.

The uneven structure may be formed using the wet etching process or the dry etching process, or be formed using both the wet etching process and the dry etching process.

The dry etching method may be plasma etching, sputter etching, or ion etching, and the wet etching process may be a PEC process.

In the case of the PEC process, the shape of the uneven structure having a fine size may be adjusted by controlling the amount of an etching solution (for example, KOH) and an etching rate difference due to GaN crystallinity. Further, the shape of the uneven structure may be periodically adjusted through etching after formation of a mask.

The first electrode 190 is disposed on the first conductivity-type semiconductor layer 122. The first electrode 190 is formed of one selected from the group consisting of molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh) and iridium (Ir), or an alloy thereof.

The insulating layer 210 of the transistor unit 200 serves to electrically insulate the light emitting device unit 100 and the transistor unit 200 from each other. The insulating layer 210 may be formed of an electrically insulating material, for example, at least one of aluminum oxide ($Al_2O_3$), silicon oxide ($SiO_2$), silicon nitride ($Si_3N_4$) or titanium oxide (TiOx).

The transistor unit 200 may include various transistors according to embodiments. For example, the transistor unit 200 may include bipolar junction transistors or field effect transistors, but is not limited thereto.

Both kinds of transistors include a common structure including three electrodes in which a semi-conductive material is disposed within a channel region. The three electrodes of the bipolar junction transistor may be referred to as an emitter, a collector and a base, and the three electrodes of the field effect transistor may be referred to a source, a drain and a gate. In the bipolar junction transistor, current between the emitter and the collector is controlled by current flowing between the base and the emitter, and in the field effect transistor, current flowing between the source and the drain is controlled by voltage between the gate and the source. Although the embodiment, which will be described hereinafter, illustrates the transistor unit 200 as employing the field effect transistors, the disclosure is not limited thereto.

The transistor unit 200 may be operated as a switch of the light emitting device unit 100. For example, if the field effect transistors are applied to the transistor unit 200, current between the source and the drain is controlled by voltage between the gate and the source and is applied to an electrode of the light emitting device unit 100, and thus the light emitting device unit 100 may be operated under control of the transistor unit 200.

Further, for the purpose of convenience of the fabrication process, at least one of the semiconductor layers of the transistor unit 200 in accordance with the embodiment may be formed from the same layer as at least one of the semiconductor layers of the light emitting device unit 100. For example, the third conductivity-type semiconductor layer 220 and the first conductivity-type semiconductor layer 122 may be formed from the same layer.

Semiconductor layers of the transistor unit 200 may be disposed on the insulating layer 210. The semiconductor layers of the transistor unit 200 may be differently composed according as whether or not the transistors of the transistor unit 200 are of a P-type or an N-type, and the semiconductor layers may be differently composed according to an ability of accommodating, transmitting and donating electric charges. Composition of a semi-conductive material accommodating, transmitting and donating holes or electrons may be varied according to doping materials.

For example, the semiconductor layers of the transistor unit 200 may include the third conductivity-type semiconductor layer 220, the undoped semiconductor layer 230 disposed on the third conductivity-type semiconductor layer 220, the fourth conductivity-type semiconductor layer 240 disposed on the undoped semiconductor layer 230, and the fifth conductivity-type semiconductor layer 250 disposed on the fourth conductivity-type semiconductor layer 240.

The third conductivity-type semiconductor layer 220 and the fifth conductivity-type semiconductor layer 250 may be formed of a group III-V compound semiconductor doped with a first conductivity-type dopant. If the third conductivity-type semiconductor layer 220 and the fifth conductivity-type semiconductor layer 250 are N-type semiconductor layers, the first conductivity-type dopant is an N-type dopant and the N-type dopant may include Si, Ge, Sn, Se, Te, etc.

Further, the fourth conductivity-type semiconductor layer 240 may be formed of a group III-V compound semiconductor doped with a second conductivity-type dopant, for example, a semiconductor material having a formula of $In_xAl_yGa_{1-x-y}N$ (0≤x≤1, 0≤y≤1, 0≤x+y≤1) or AlGaN. If the fourth conductivity-type semiconductor layer 240 is a P-type semiconductor layer, the second conductivity-type dopant is a P-type dopant and the P-type dopant may include Mg, Zn, Ca, Sr, Ba, etc.

The undoped semiconductor layer 230 may be disposed between the third conductivity-type semiconductor layer 220 and the fourth conductivity-type semiconductor layer 240. The undoped semiconductor layer 230 may include GaN. The undoped semiconductor layer 230 is a region which is located under the gate to form a channel and causes depletion to lower the operating voltage of the transistor unit 200 when gate voltage is applied to the undoped semiconductor layer 230.

The gate insulating film 290 may be disposed on the undoped semiconductor layer 230. The gate electrode 270 may be disposed on the gate insulating film 290. The source electrode 260 may be disposed on the fifth conductivity-type semiconductor layer 250, and the drain electrode 280 may be disposed on the third conductivity-type semiconductor layer 220.

The gate insulating film 290 may be formed of an insulating material, for example, an inorganic film, such as silicon oxide or silicon nitride, or an organic film, such as polyimide.

Hereinafter, a fabricating method of the light emitting device 300 in accordance with the embodiment will be described with reference to the annexed drawings.

FIGS. 2A to 2G are sectional views illustrating a fabricating method of the transistor unit 200 and the light emitting device unit 100 associated with each other in accordance with one embodiment.

Figure 2A:
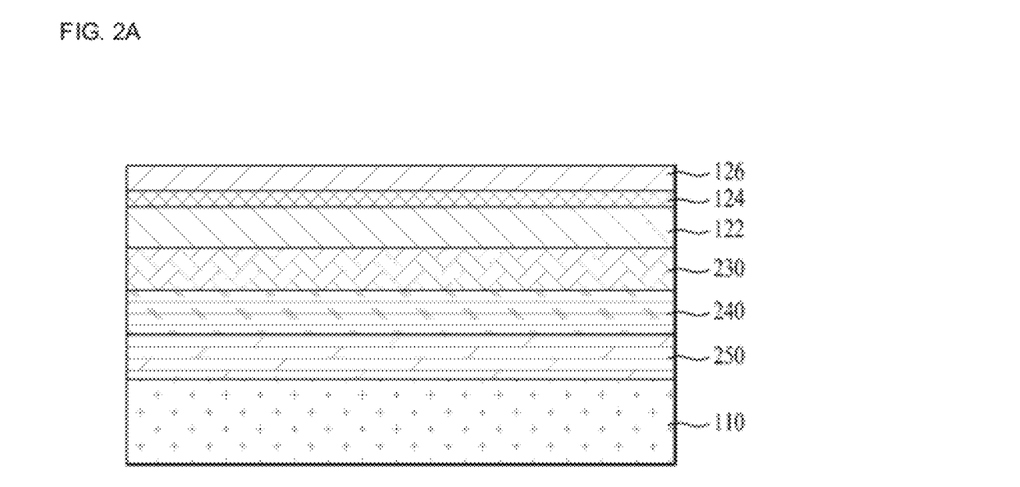
FIGS. 2A to 2G are sectional views illustrating a fabricating method of a light emitting device formed in association with transistors in accordance with one embodiment.

As shown in FIG. 2A, a substrate 110 is prepared. The substrate 110 may be a conductive substrate or an insulating substrate, and be formed of, for example, at least one of sapphire ($Al_2O_3$), SiC, Si, GaAs, GaN, ZnO, Si, GaP, InP, Ge or $Ga_2O_3$. The upper surface of the substrate 110 may have an uneven structure, and the uneven structure is not limited. Impurities may be removed from the surface of the substrate 110 through wet cleaning.

The semiconductor layers 250, 240 and 230 of the transistor unit 200 and the semiconductor layers 122, 124 and 126 of the light emitting structure 120 of the light emitting device unit 100 are sequentially formed on the substrate 110. Here, at least one of the semiconductor layers of the transistor unit 200 may coincide with at least one of the semiconductor layers of the light emitting device unit 100. For example, the third conductive-type semiconductor layer 220 from among the semiconductor layers of the transistor unit 200 may coincide with the first conductivity-type 122 from among the semiconductor layers of the light emitting device unit 100.

Further, the semiconductor layers 250, 240 and 230 of the transistor unit 200 and the semiconductor layers 122, 124 and 126 of the light emitting structure 120 of the light emitting device unit 100 may be formed, for example, using a method, such as metal organic chemical vapor deposition (MOCVD), chemical vapor deposition (CVD), plasma-enhanced chemical vapor deposition (PECVD), molecular beam epitaxy (MBE), or hybrid vapor phase epitaxy (HVPE), but is not limited thereto.

Here, a buffer layer (not shown) may be grown between the semiconductor layers 250, 240 and 230 of the transistor unit 200 and the substrate 110. The buffer layer serves to reduce lattice mismatch and a thermal expansion coefficient difference between materials. The buffer layer may be formed of a group III-V compound semiconductor, for example, at least one of GaN, InN, AlN, InGaN, AlGaN, InAlGaN or AlInN. An undoped semiconductor layer may be formed on the buffer layer, but the disclosure is not limited thereto.

The semiconductor layers 250, 240, 230 and 220 of the transistor unit 200 may include the fifth conductivity-type semiconductor layer 250, the fourth conductivity-type semiconductor layer 240, the undoped semiconductor layer 230 and the third conductivity-type semiconductor layer 220.

Here, the first conductivity-type semiconductor layer 122 or the fifth conductivity-type semiconductor layer 250 may be formed of a group III-V compound semiconductor doped with a first conductivity-type dopant. If the first conductivity-type semiconductor layer 122 or the fifth conductivity-type semiconductor layer 250 is an N-type semiconductor layer, the first conductivity-type dopant is an N-type dopant and the N-type dopant may include Si, Ge, Sn, Se, Te, etc.

The first conductivity-type semiconductor layer 122 or the fifth conductivity-type semiconductor layer 250 may include a semiconductor material having a formula of $Al_xIn_yGa_{(1-x-y)}N$ (0≤x≤1, 0≤y≤1, 0≤x+y≤1). For example, the first conductivity-type semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP or InP.

The first conductivity-type semiconductor layer 122 or the fifth conductivity-type semiconductor layer 250 may be formed by injecting tri-methyl gallium (TMGa) gas, ammonia ($NH_3$) gas, nitrogen ($N_2$) gas or silane ($SiH_4$) gas including an N-type impurity, such as silicon (Si), into a chamber.

Further, the second conductivity-type semiconductor layer 126 or the fourth conductivity-type semiconductor layer 240 may be formed of a group III-V compound semiconductor doped with a second conductivity-type dopant, for example, a semiconductor material having a formula of $In_xAl_yGa_{1-x-y}N$ (0≤x≤1, 0≤y≤1, 0≤x+y≤1) or AlGaN. If the second conductivity-type semiconductor layer 126 or the fourth conductivity-type semiconductor layer 240 is a P-type semiconductor layer, the second conductivity-type dopant is a P-type dopant and the P-type dopant may include Mg, Zn, Ca, Sr, Ba, etc.

The second conductivity-type semiconductor layer 126 or the fourth conductivity-type semiconductor layer 240 may be a P-type GaN layer formed by injecting tri-methyl gallium (TMGa) gas, ammonia ($NH_3$) gas, nitrogen ($N_2$) gas or bisethyl cyclo pentadienyl magnesium ($EtCp_2Mg$){Mg$(C_2H_5C_5H_4)_2$} including a P-type impurity, such as magnesium (Mg) into a chamber, but is not limited thereto.

The undoped semiconductor layer (GaN) 230 may be formed between the third conductivity-type semiconductor layer 220 and the fourth conductivity-type semiconductor layer 240. The undoped semiconductor layer 230 may include GaN, and is a region which is located under the gate to form a channel and causes depletion to lower the operating voltage of the transistor unit 200 when gate voltage is applied to the undoped semiconductor layer 230.

The active layer 124 emits light having energy determined by an intrinsic energy band of a material of the active layer (light emitting layer) where the light is generated when carriers injected into the active layer 124 through the first conductivity-type semiconductor layer 122 and the second conductivity-type semiconductor layer 126 meet.

The active layer 124 may have at least one selected from among the group consisting of a single quantum well structure, a multi quantum well (MQW) structure, a quantum wire structure and a quantum dot structure. For example, the active layer 124 may have a multi quantum well (MQW) structure by injecting tri-methyl gallium (TMGa) gas, ammonia (NH$_3$) gas, nitrogen (N$_2$) gas or tri-methyl indium (TMIn) gas, but is not limited thereto.

A well layer/a barrier layer of the active layer 124 may be formed in a pair structure, i.e., at least one of InGaN/GaN, InGaN/InGaN, GaN/AlGaN, InAlGaN/GaN, GaAs(In-GaAs)/AlGaAs and GaP(InGaP)/AlGaP, but is not limited thereto. The well layer may be formed of a material having a narrower band gap than the barrier layer.

A conductive clad layer (not shown) may be formed on and/or under the active layer 124. The conductive clad layer may be formed of an AlGaN-based semiconductor, and have a higher band gap than the band gap of the active layer 124.

In the embodiment, the first conductivity-type semiconductor layer 122 and the fifth conductivity-type semiconductor layer 250 may be P-type semiconductor layers, and the second conductivity-type semiconductor layer 126 and the fourth conductivity-type semiconductor layer 240 may be N-type semiconductor layers. Further, a semiconductor layer having opposite polarity to the second conductivity-type semiconductor layer 126, for example, an N-type semiconductor layer (not shown) if the second conductivity-type semiconductor layer 126 is a P-type semiconductor layer, may be formed on the second conductivity-type semiconductor layer 126. Thereby, the light emitting structure 120 of the light emitting device unit 100 may be formed in one structure from among an N—P junction structure, a P—N junction structure, an N—P—N junction structure, and a P—N—P junction structure, and the transistors of the transistor unit 200 may be formed in one structure from among an N—P—N junction structure and a P—N—P junction structure.

Figure 2B:
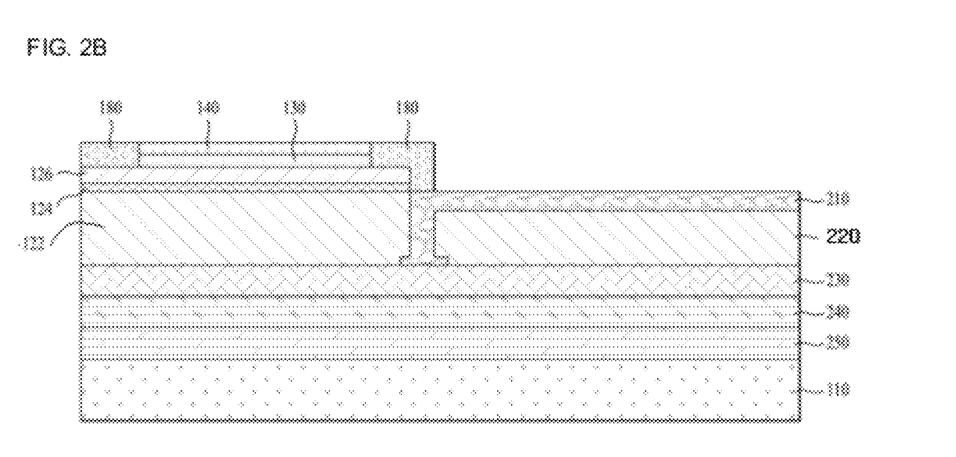

Further, as shown in FIG. 2B, the first conductivity-type semiconductor layer 122 is exposed by etching one side surface of each of the second conductivity-type semiconductor layer 126 and the active layer 124, and then, in order to form the insulating layer 210 to isolate the transistor unit 200 and the light emitting device unit 100 from each other, the first conductivity-type semiconductor layer 122 is etched to form a groove.

Thereafter, the insulating layer 210 is formed in the groove and on the exposed first conductivity-type semiconductor layer 122, thereby isolating the transistor unit 200 and the light emitting device unit 100 from each other. Thereby, the third conductivity-type semiconductor layer 220 is isolated from the first conductivity-type semiconductor layer 122.

That is, for the purpose of convenience of the fabrication process, the third conductivity-type semiconductor layer 220 and the first conductivity-type semiconductor layer 122 may be formed from the same layer.

The insulating layer 210 may be formed of an electrical insulating material, for example, include at least one of aluminum oxide (Al$_2$O$_3$), silicon oxide (SiO$_2$), silicon nitride (Si$_3$N$_4$) or titanium oxide (TiOx).

The channel layer 180 is formed on the second conductivity-type semiconductor layer 126, a groove is formed by etching the channel layer 180, and then the Ohmic layer 130 and the reflective layer 140 are formed in the groove. Formation of such a groove may be carried out through a process, such as dry etching using a mask.

The channel layer 180 may include at least one of a metal material or an insulating material. In case that the metal material is used for the channel layer 180, a material having lower electrical conductivity than the material of the Ohmic layer 130 is used so that current applied to the Ohmic layer 130 is not applied to the channel layer 180.

For example, the channel layer 180 may include at least one of titanium (Ti), nickel (Ni), platinum (Pt), lead (Pb), rhodium (Rh), iridium (Ir) or tungsten (W), or include at least one of aluminum oxide (Al$_2$O$_3$), silicon oxide (SiO$_2$), silicon nitride (Si$_3$N$_4$) or titanium oxide (TiOx), or include at least one of indium tin oxide (ITO), aluminum zinc oxide (AZO) or indium zinc oxide (IZO). Further, the channel layer 180 may include at least one of titanium (Ti), nickel (Ni), platinum (Pt), tungsten (W), molybdenum (Mo), vanadium (V) or iron (Fe).

The channel layer 180 has the effect of protecting the elements located under the channel layer 180 from etching during etching of the light emitting structure 120 and stably supporting the light emitting device 300 to prevent the light emitting device 300 from being damaged during the fabrication process.

The Ohmic layer 130 may be stacked on the semiconductor conductivity-type semiconductor layer 126 to a thickness of about 200 Å. The Ohmic layer 130 may selectively use a light-transmitting conductive layer and metal, and for example, include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf, and is not limited thereto. Further, the Ohmic layer 130 may be formed through sputtering and electron beam deposition.

The reflective layer 140 may effectively reflect light generated from the active layer 124 to greatly improve light extraction efficiency of the light emitting device, and have a thickness of about 2,500 ∪. For example, the reflective layer 140 may be formed of metal including at least one of Ag, Ni, Al, Rh, Pd, Ir, Ru, Mg, Zn, Pt, Au or Hf, or an alloy thereof. Further, the reflective layer 140 may be formed in a multi-layer structure using the above metal or alloy and a light-transmitting conductive material, such as ITO, IZO, IZTO, IAZO, IGZO, IGTO, AZO or ATO. In more detail, the reflective layer 140 may be formed in a stacked structure, such as IZO/Ni, AZO/Ag, IZO/Ag/Ni, AZO/Ag/Ni, Ag/Cu or Ag/Pd/Cu.

Figure 2C:
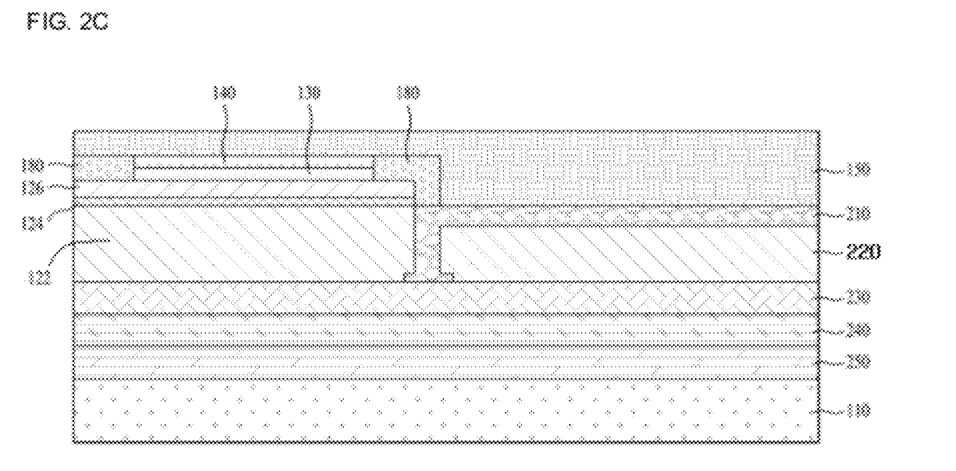

Thereafter, as shown in FIG. 2C, the bonding layer 150 to achieve bonding between the support substrate 160 and the light emitting device unit 100 or bonding between the support substrate 160 and the transistor unit 200 may be formed on the reflective layer 140, the channel layer 180 and the insulating layer 210.

The bonding layer 150 may be formed of one selected from the group consisting of gold (Au), tin (Sn), indium (In), silver (Ag), nickel (Ni), niobium (Nb) and copper (Cu), or an alloy thereof.

Figure 2D:
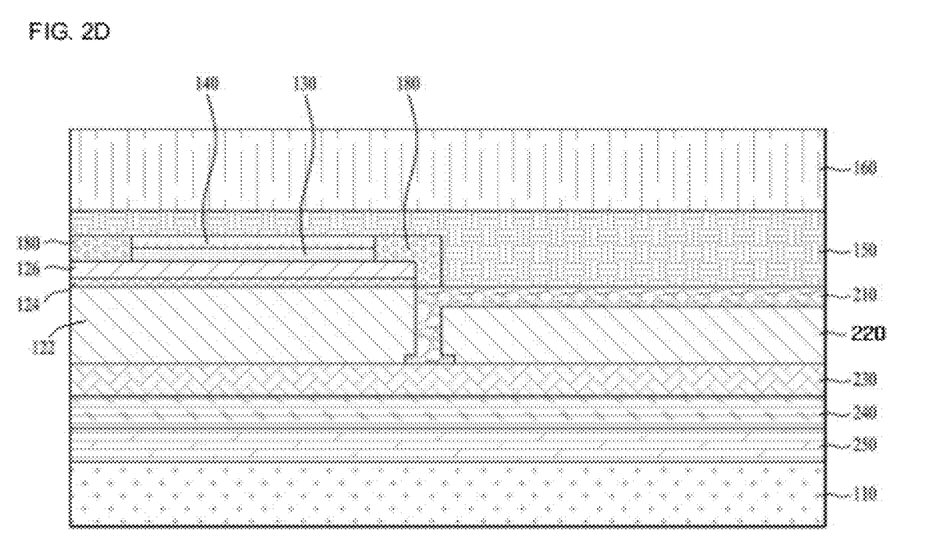

Thereafter, as shown in FIG. 2D, the support substrate 160 may be formed on the bonding layer 150.

The support substrate 160 may be formed of one selected from the group consisting of molybdenum (Mo), silicon (Si), tungsten (W), copper (Cu) and aluminum (Al), or an alloy thereof. Further, for example, the support substrate 160 may selectively include gold (Au), an Cu alloy, nickel (Ni), copper-tungsten (Cu—W), and a carrier wafer (for example, GaN, Si, Ge, GaAs, ZnO, SiGe, SiC, SiGe, Ga$_2$O$_3$, etc.). As a method for forming the conductive support substrate 160, an electrochemical metal deposition method or a bonding method using a eutectic metal may be used.

The support substrate 160 may be formed of an insulating material according to embodiments, and the insulating material may be a non-conductive oxide or nitride. For example, the support substrate 160 may be formed of a silicon oxide (SiO$_2$) layer, an oxynitride layer, or an aluminum oxide layer.

Figure 2E:
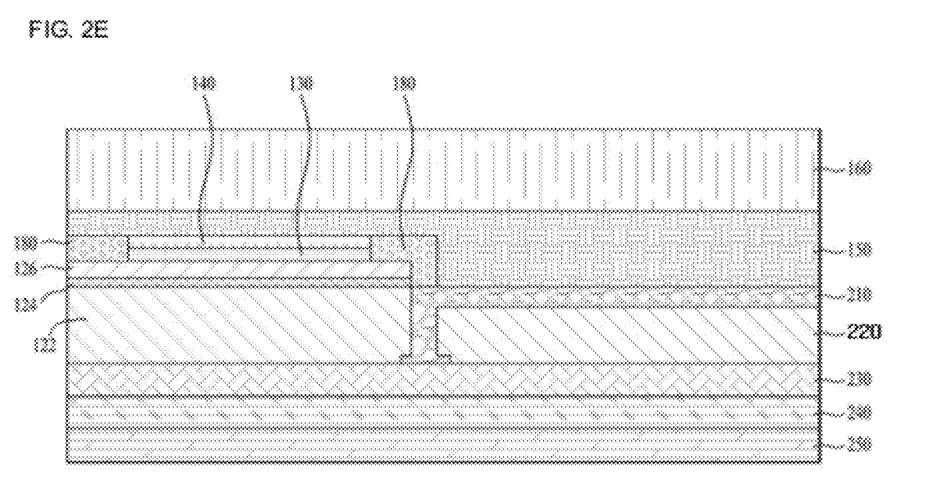

Thereafter, as shown in FIG. 2E, the substrate 110 is removed.

Removal of the substrate 110 may be carried out using laser lift off (LLO) using an excimer laser or using dry or wet etching.

For example, in the case of laser lift off (LLO), when an excimer laser having a designated wavelength is focused and irradiated in the direction of the substrate 110, heat energy is concentrated upon an interface between the substrate 110 and the fifth conductivity-type semiconductor layer 250, and the interface is resolved into gallium and nitrogen atoms and thus the substrate 110 at a region through which the laser passes is momentarily isolated from the fifth conductivity-type semiconductor layer 250.

Figure 2F:
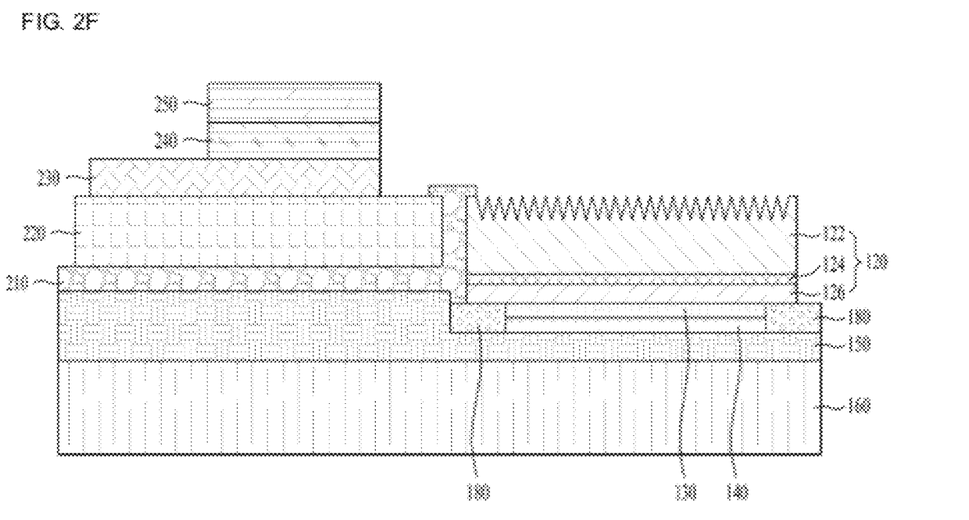

Thereafter, as shown in FIG. 2F, after the resulting product shown in FIG. 2E is reversed, the first conductivity-type semiconductor layer 122 is exposed by etching the side surfaces of the semiconductor layers 220, 230, 240 and 250, and the side surface of the light emitting structure 120 is etched. Here, a portion of the side surface of the light emitting structure 120 may be etched through a method in which etching is stopped when a material forming the channel 180 is detected through an end-point detection method. An etching position may be adjusted such that the channel layer 180 is located under the etched light emitting structure 120.

The channel layer 180 has the effect of protecting the elements located under the channel layer 180 from etching during etching of the light emitting structure 120 and stably supporting the light emitting device 300 to prevent the light emitting device 300 from being damaged during the fabrication process.

An even structure is formed on the upper surface of the first conductivity-type semiconductor layer 122, thereby improving light extraction efficiency.

Such an uneven structure of the light emitting structure 120 may reduce total reflection on the surface of the first conductivity-type semiconductor layer 122 to increase light extraction effects by changing an angle incidence of light emitted from the active layer 124 and incident upon the first conductivity-type semiconductor layer 122, and reduce absorption of light emitted from the active layer 124 by the light emitting structure 120 to increase luminous efficiency.

The uneven structure may be formed periodically or aperiodically, and the shape of the uneven structure is not limited. For example, the uneven structure may have a single shape, such as a rectangle, a hemisphere, a triangle or a trapezoid, or a combined shape.

The uneven structure may be formed using the wet etching process or the dry etching process, or be formed using both the wet etching process and the dry etching process.

The dry etching method may be plasma etching, sputter etching, or ion etching, and the wet etching process may be the PEC process.

In the case of the PEC process, the shape of the uneven structure having a fine size may be adjusted by controlling the amount of an etching solution (for example, KOH) and an etching rate difference due to GaN crystallinity. Further, the shape of the uneven structure may be periodically adjusted through etching after formation of a mask.

Thereafter, portions of the third conductivity-type semiconductor layer 220 and the undoped semiconductor layer 230 of the transistor unit 200 are exposed by etching the side surfaces of the semiconductor layers 230, 240 and 250.

Figure 2G:
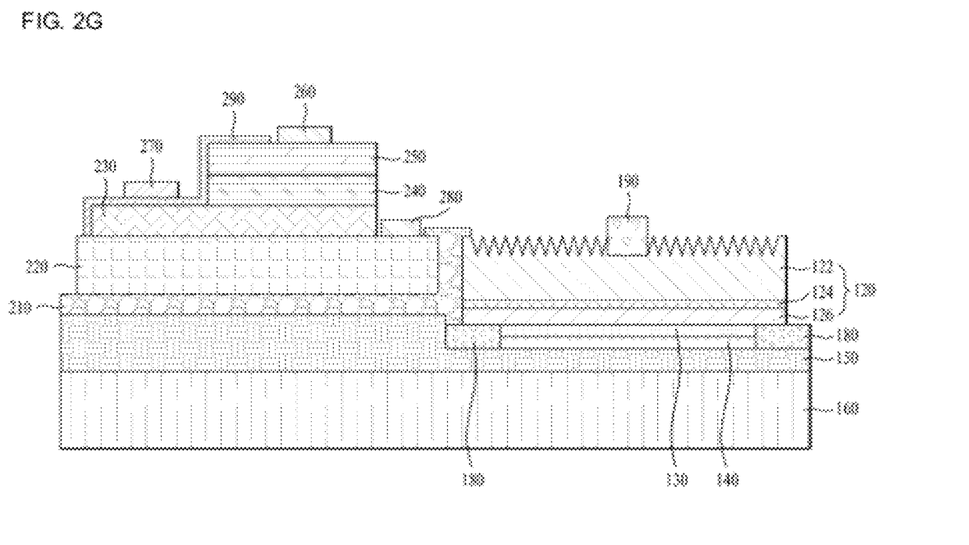

Thereafter, as shown in FIG. 2G, the gate insulating film 290 is formed on the upper surface of the exposed portion of the undoped semiconductor layer 230, the side surfaces of the fourth conductivity-type semiconductor layer 240 and the fifth conductivity-type semiconductor layer 250 and the upper surface of a portion of the fifth conductivity-type semiconductor layer 250.

The gate insulating film 290 may be formed of an insulating material, for example, an inorganic film, such as silicon oxide or silicon nitride, or an organic film, such as polyimide.

Thereafter, the gate electrode 270 is formed on the gate insulating film 290, the source electrode 260 is formed on the fifth conductivity-type semiconductor layer 250, and the drain electrode 280 is formed on the third conductivity-type semiconductor layer 220.

The gate electrode 270, the source electrode 260 and the drain electrode 280 may be formed of at least one selected from the group consisting of molybdenum (Mo), chrome (Cr), nickel (Ni), gold (Au), aluminum (Al), titanium (Ti), platinum (Pt), vanadium (V), tungsten (W), lead (Pb), copper (Cu), rhodium (Rh) and iridium (Ir), or an alloy thereof.

Further, the first electrode 190 may be formed on the first conductivity-type semiconductor layer 122. In the same manner, the first electrode 190 may be formed of one selected from the group consisting of molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh) and iridium (Ir), or an alloy thereof.

Further, in accordance with the embodiment, a passivation layer may be deposited on at least portion of the upper surface of the channel layer 180, the side surface of the light emitting structure 120 or the upper surface of the first electrode 190. Here, the passivation layer may be formed of an insulating material, and the insulating material may be a non-conductive oxide or nitride. For example, the passivation layer may be formed of a silicon oxide (SiO$_2$) layer, an oxynitride layer, or an aluminum oxide layer.

Therefore, the light emitting device unit 100 in accordance with the embodiment is formed in association with the transistor unit 200 so that the fabrication process of the transistor unit 200 and the light emitting device unit 100 may be rapidly and conveniently executed and the light emitting device unit 100 may be conveniently controlled by the fabricated transistor unit 200.

That is, the transistor unit 200 may be operated as a switch of the light emitting device unit 100. For example, if field effect transistors are applied for the transistor unit 200, current between the source electrode 260 and the drain electrode 280 is controlled by voltage between the gate electrode 270 and the source electrode 260 and is applied to the first electrode 190 of the light emitting device unit 100, and thus the light emitting device unit 100 may be operated under control of the transistor unit 200.

Figure 3:
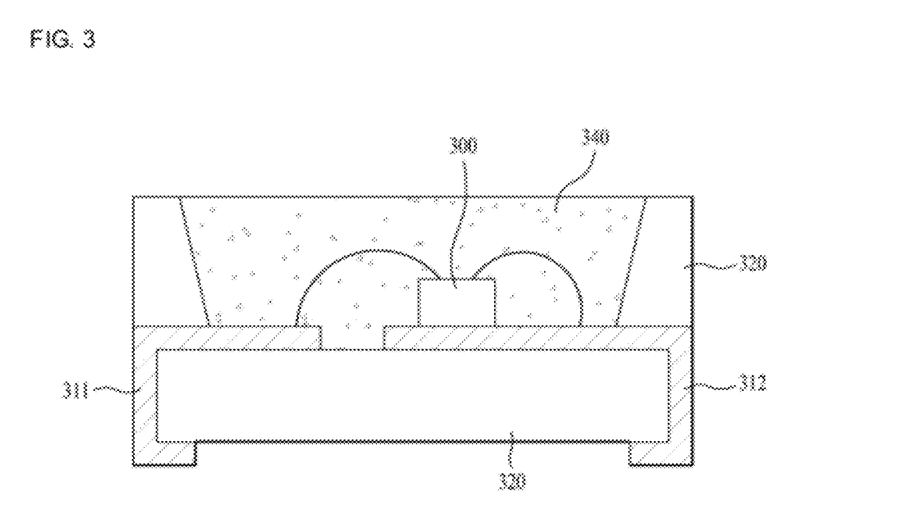
FIG. 3 is a sectional view illustrating a light emitting device package in accordance with one embodiment.

FIG. 3 is a sectional view illustrating a light emitting device package in accordance with one embodiment.

As shown in FIG. 3, the light emitting device package in accordance with the embodiment includes a package body 320, a first electrode layer 311 and a second electrode layer 312 disposed on the package body 320, a light emitting device 300 in accordance with the embodiment disposed on the package body 320 and electrically connected to the first electrode layer 311 and the second electrode layer 312, and a resin layer 340 surrounding the light emitting device 300. The light emitting device 300 corresponds to the light emitting device 300 shown in FIG. 1, and may include the light emitting device unit 100 and the transistor unit 200.

The package body 320 may be disposed of silicon, synthetic resin or metal, and be provided with an inclined plane around the light emitting device 300 to increase light extraction efficiency.

The first electrode layer 311 and the second electrode layer 312 are electrically isolated from each other and provide power to the light emitting device 300. Further, the first electrode layer 311 and the second electrode layer 312 may serve to reflect light generated from the light emitting device 300 to increase light efficiency and to discharge heat generated from the light emitting device 300 to the outside.

The light emitting device 300 may be disposed on the package body 320 or be disposed on the first electrode layer 311 or the second electrode layer 312.

The light emitting device 300 may be electrically connected to the first electrode layer 311 and the second electrode layer 312 by one of a wire bonding method, a flip chip method or a die bonding method.

The resin layer 340 may surround the light emitting device 300 to protect the light emitting device 300. Further, the resin layer 340 includes phosphors, and may thus change the wavelength of light emitted from the light emitting device 300.

The light emitting device package may include at least one or a plurality of the light emitting devices in accordance with the above-described embodiments, and the number of the light emitting devices is not limited thereto.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a bonding layer disposed on a support substrate;
   an insulating layer having a first portion disposed at one side on the bonding layer;
   a transistor unit disposed on the first portion of the insulating layer;
   a light emitting device unit disposed at the other side on the bonding layer and including a first conductivity-type semiconductor layer, an active layer and a second conductivity-type semiconductor layer, the light emitting device unit and the transistor unit being isolated from each other in a first direction by a second portion of the insulating layer disposed between the transistor unit and the light emitting device unit; and
   at least one channel layer comprising first and second parts,
   wherein the first part of the channel layer is disposed between the bonding layer and the second portion of the insulating layer and between the bonding layer and the light emitting device in a second direction substantially perpendicular to the first direction,
   wherein the first art of the channel layer has a to surface located below a bottom surface of the light emitting device, and
   wherein the second part of the channel layer is disposed between the bonding layer and the light emitting device unit in the second direction.

2. The light emitting device according to claim 1, wherein the transistor unit is operated as a switch of the light emitting device unit.

3. The light emitting device according to claim 1, wherein the transistor unit includes:
   a third conductivity-type semiconductor layer disposed on the first portion of the insulating layer and beside the second portion of the insulating layer;
   an undoped semiconductor layer disposed on the third conductivity-type semiconductor layer;
   a fourth conductivity-type semiconductor layer disposed on the undoped semiconductor layer;
   a fifth conductivity-type semiconductor layer disposed on the fourth conductivity-type semiconductor layer;
   a gate insulating film disposed on the undoped semiconductor layer;
   a gate electrode disposed on the gate insulating film;
   a source electrode disposed on the fifth conductivity-type semiconductor layer; and
   a drain electrode disposed on the third conductivity-type semiconductor layer.

4. The light emitting device according to claim 3, wherein current between the source electrode and the drain electrode is controlled by voltage between the gate electrode and the source electrode, and is applied to at least one of electrodes disposed on the first conductivity-type semiconductor layer or the second conductivity-type semiconductor layer of the light emitting device unit.

5. The light emitting device according to claim 3, wherein the third conductivity-type semiconductor layer is electrically isolated from the first conductivity-type semiconductor layer by the second portion of the insulating layer.

6. A light emitting device, comprising:
   a bonding layer disposed on a support substrate;
   an insulating layer having a first portion disposed at one side on the bonding layer;
   a transistor unit disposed on the first portion of the insulating layer;
   a light emitting device unit disposed at the other side on the bonding layer, including a first conductivity-type semiconductor layer, an active layer and a second conductivity-type semiconductor layer, and the transistor unit and the light emitting device unit being isolated from each other in a first direction by a second portion of the insulating layer disposed between the transistor unit and the light emitting device unit; and
   at least one channel layer comprising first and second parts,
   wherein the first part of the channel layer is disposed between the bonding layer and the second portion of the insulating layer and between the bonding layer and the light emitting device unit in a second direction substantially perpendicular to the first direction,
   wherein the first part of the channel layer has a top surface located below a bottom surface of the light emitting device,
   wherein the second part of the channel layer is disposed between the bonding layer and the light emitting device unit in the second direction,
   wherein the transistor unit includes:
      a third conductivity-type semiconductor layer disposed on the first portion of the insulating layer and beside the second portion of the insulating layer;
      an undoped semiconductor layer disposed on the third conductivity-type semiconductor layer;
      a fourth conductivity-type semiconductor layer disposed on the undoped semiconductor layer;

a fifth conductivity-type semiconductor layer disposed on the fourth conductivity-type semiconductor layer;
a gate insulating film disposed on the undoped semiconductor layer;
a gate electrode disposed on the gate insulating film;
a source electrode disposed on the fifth conductivity-type semiconductor layer; and
a drain electrode disposed on the third conductivity-type semiconductor layer.

7. The light emitting device according to claim 6, wherein the third conductivity-type semiconductor layer is electrically isolated from the first conductivity-type semiconductor layer by the second portion of the insulating layer.

8. A light emitting device, comprising:
a support substrate;
a transistor unit disposed at one side of the upper surface of the support substrate;
a light emitting device unit disposed at the other side of the upper surface of the support substrate;
an insulating layer having a first portion and a second portion, the second portion disposed between the transistor unit and the light emitting device unit to isolate the transistor unit from the light emitting device unit in a first direction, and the first portion disposed between the support substrate and the transistor unit; and
at least one channel layer comprising a first part and a second part,
wherein the first part of the channel layer is disposed between the bonding layer and the second portion of the insulating layer and between the bonding layer and the light emitting device unit in a second direction substantially perpendicular to the first direction,
wherein the first part of the channel layer has a top surface located below a bottom surface of the light emitting device, and
wherein the second part of the channel layer is disposed between the bonding layer and the light emitting device unit in the second direction.

9. The light emitting device according to claim 8, further comprising a bonding layer disposed between the support substrate and the insulating layer and between the support substrate and the light emitting device unit.

10. The light emitting device according to claim 8, wherein the light emitting device unit includes a first conductivity-type semiconductor layer, an active layer and a second conductivity-type semiconductor layer sequentially disposed on the other side of the upper surface of the support substrate.

11. The light emitting device according to claim 10, wherein the transistor unit includes:
a third conductivity-type semiconductor layer disposed on the first portion of the insulating layer and beside the second portion of the insulating layer;
an undoped semiconductor layer disposed on the third conductivity-type semiconductor layer;
a fourth conductivity-type semiconductor layer disposed on the undoped semiconductor layer;
a fifth conductivity-type semiconductor layer disposed on the fourth conductivity-type semiconductor layer;
a gate insulating film disposed on the undoped semiconductor layer;
a gate electrode disposed on the gate insulating film;
a source electrode disposed on the fifth conductivity-type semiconductor layer; and
a drain electrode disposed on the third conductivity-type semiconductor layer.

12. The light emitting device according to claim 11, wherein at least one of the first conductivity-type semiconductor layer or the second conductivity-type semiconductor layer is formed from the same layer as at least one of the third conductivity-type semiconductor layer, the undoped semiconductor layer, the fourth conductivity-type semiconductor layer or the fifth conductivity-type semiconductor layer.

13. The light emitting device according to claim 11, wherein the first conductivity-type semiconductor layer and the fifth conductivity-type semiconductor layer include the same material.

14. The light emitting device according to claim 11, wherein the second conductivity-type semiconductor layer and the fourth conductivity-type semiconductor layer include the same material.

15. The light emitting device according to claim 11, wherein the gate insulating film extends to one side surface of each of the fourth and fifth conductivity-type semiconductor layers and one portion of the upper surface of the fifth conductivity-type semiconductor layer.

16. The light emitting device according to claim 11, further comprising a reflective layer disposed between the support substrate and the second conductivity-type semiconductor layer.

17. The light emitting device according to claim 16, further comprising an ohmic layer disposed between the reflective layer and the second conductivity-type semiconductor layer.

18. The light emitting device according to claim 17, wherein the at least one channel layer comprises a plurality of channel layers facing each other.

19. The light emitting device according to claim 18, wherein the ohmic layer and the reflective layer are disposed between the channel layers.

* * * * *